(12) United States Patent
Taubman

(10) Patent No.: US 7,957,441 B2
(45) Date of Patent: Jun. 7, 2011

(54) METHOD AND APPARATUS FOR RESONANT FREQUENCY WAVEFORM MODULATION

(75) Inventor: Matthew S. Taubman, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 23 days.

(21) Appl. No.: 12/613,229

(22) Filed: Nov. 5, 2009

(65) Prior Publication Data

US 2011/0102094 A1    May 5, 2011

(51) Int. Cl.
*H01S 3/00* (2006.01)
*H01S 3/10* (2006.01)
(52) U.S. Cl. .................................................. 372/38.07
(58) Field of Classification Search .............. 332/117, 332/149; 372/38.1, 38.02, 38.04, 38.07
See application file for complete search history.

(56) References Cited

U.S. PATENT DOCUMENTS 6,667,666 B2 * 12/2003 Uzunoglu ..................... 331/173

OTHER PUBLICATIONS

Horowitz, Paul and Hill, Winfield, The Art of Electronics, Second Edition, Cambridge University Press, 1989, pp. 41-42.
Horowitz, Paul and Hill, Winfield, The Art of Electronics, Second Edition, Cambridge University Press, 1989, pp. 403, 406-408.
Sirtori, Carlo, et al., The quantum cascade laser. A device based on two-dimensional electronic subbands, Pure Appl. Opt. 7 (1998) 373-381 Printed in the UK.

* cited by examiner

*Primary Examiner* — David Mis
(74) *Attorney, Agent, or Firm* — James D. Matheson

(57) ABSTRACT

A resonant modulator device and process are described that provide enhanced resonant frequency waveforms to electrical devices including, e.g., laser devices. Faster, larger, and more complex modulation waveforms are obtained than can be obtained by use of conventional current controllers alone.

17 Claims, 3 Drawing Sheets

METHOD AND APPARATUS FOR RESONANT FREQUENCY WAVEFORM MODULATION

This invention was made with Government support under Contract DE-AC05-76RLO1830 awarded by the U.S. Department of Energy. The Government has certain rights in the invention.

FIELD OF THE INVENTION

The invention relates to resonant modulation devices and methods. More particularly, the invention includes an apparatus and method for current modulation through resonantly enhanced techniques in electrical devices including, e.g., lasers (e.g., quantum cascade lasers) and other electro-optical devices or transducers.

BACKGROUND OF THE INVENTION

Lasers and other electrical devices have become mainstream for various uses and applications. Rapid modulation of current remains one of the best techniques for producing frequency modulation (FM) and rapid, deep amplitude modulation (AM) with these devices. Yet, even with modulation provided by these devices, waveforms other than pure sine waves are often required. In addition, waveforms can be required at frequencies that are often beyond the constraints of available current controllers. Accordingly, new devices and methods are needed that can provide improved modulation including deep amplitude and frequency modulation for such electrical devices that produce waveforms at frequencies that are beyond capabilities of current controller devices.

SUMMARY OF THE INVENTION

In one aspect, the present invention includes an apparatus for rapid, high-performance current modulation of enhanced resonant waveforms for electrical devices, including, e.g., high performance lasers and laser devices. In a preferred embodiment, the invention includes one or more resonant modulation sections (segments). Each modulation section comprises an inductor-capacitor loop segment that contains an enhanced current that defines a resonant frequency sine wave waveform. This enhanced resonant waveform has a magnitude greater than or equal to that provided by the source, e.g., an oscillator source or buffer amplifier source. The modulator loop segments are connected through a common leg segment to the electrical device. The common leg segment superposes the enhanced resonant waveforms of all modulation loop segments through the electrical device. The waveform delivered through the electrical device is a composite of individual waveforms provided by individual and separate modulation loop segments.

In another aspect, the invention includes a method for rapid, high-performance current modulation of enhanced resonant waveforms in electrical devices. The method includes: enhancing a source current to a magnitude greater than a source current magnitude in each of at least two resonant frequency modulator devices to generate at least two enhanced resonant frequency waveforms. The enhanced resonant frequency waveforms and/or portions thereof are superposed to form a composite modulated waveform that is provided as an output to the electrical device. The superposition of resonant harmonics allows large and fast arbitrary waveforms to be delivered to the electrical or laser device independent of the capabilities of the current controller or driver. The source current (load) is resonated in at least two coupled and tuned resonant harmonic modulation loop segments (modulators). The tuned resonant modulation loops share the load via a common leg segment that provides the desired modulation to the laser. The invention provides significantly faster modulation to the electrical device (e.g., laser) than can be provided by a current controller alone. A preferred electrical device is a semiconductor laser, and in particular, a quantum cascade laser (QCL), but is not limited thereto. The invention finds use in applications where rapid modulation of laser devices is required, including, e.g., optical communications, chemical sensing, industrial process monitoring, and the like. The purpose of the foregoing abstract is to enable the United States Patent and Trademark Office and the public generally, especially scientists, engineers, and practitioners in the art who are not familiar with patent or legal terms or phraseology, to determine quickly from a cursory inspection, the nature and essence of the technical disclosure of the application. The abstract is neither intended to define the invention of the application, which is measured by the claims, nor is it intended to be limiting as to the scope of the invention in any way. Various advantages and novel features of the present invention are described herein and will become further readily apparent to those skilled in this art from the following detailed description. In the preceding and following descriptions, the various embodiments, including the preferred embodiments, have been shown and described. Included herein is a description of the best mode contemplated for carrying out the invention. As will be realized, the invention is capable of modification in various respects without departing from the invention. Accordingly, the drawings and description of the preferred embodiments set forth hereafter are to be regarded as illustrative in nature, and not as restrictive.

DETAILED DESCRIPTION

Figure 1:
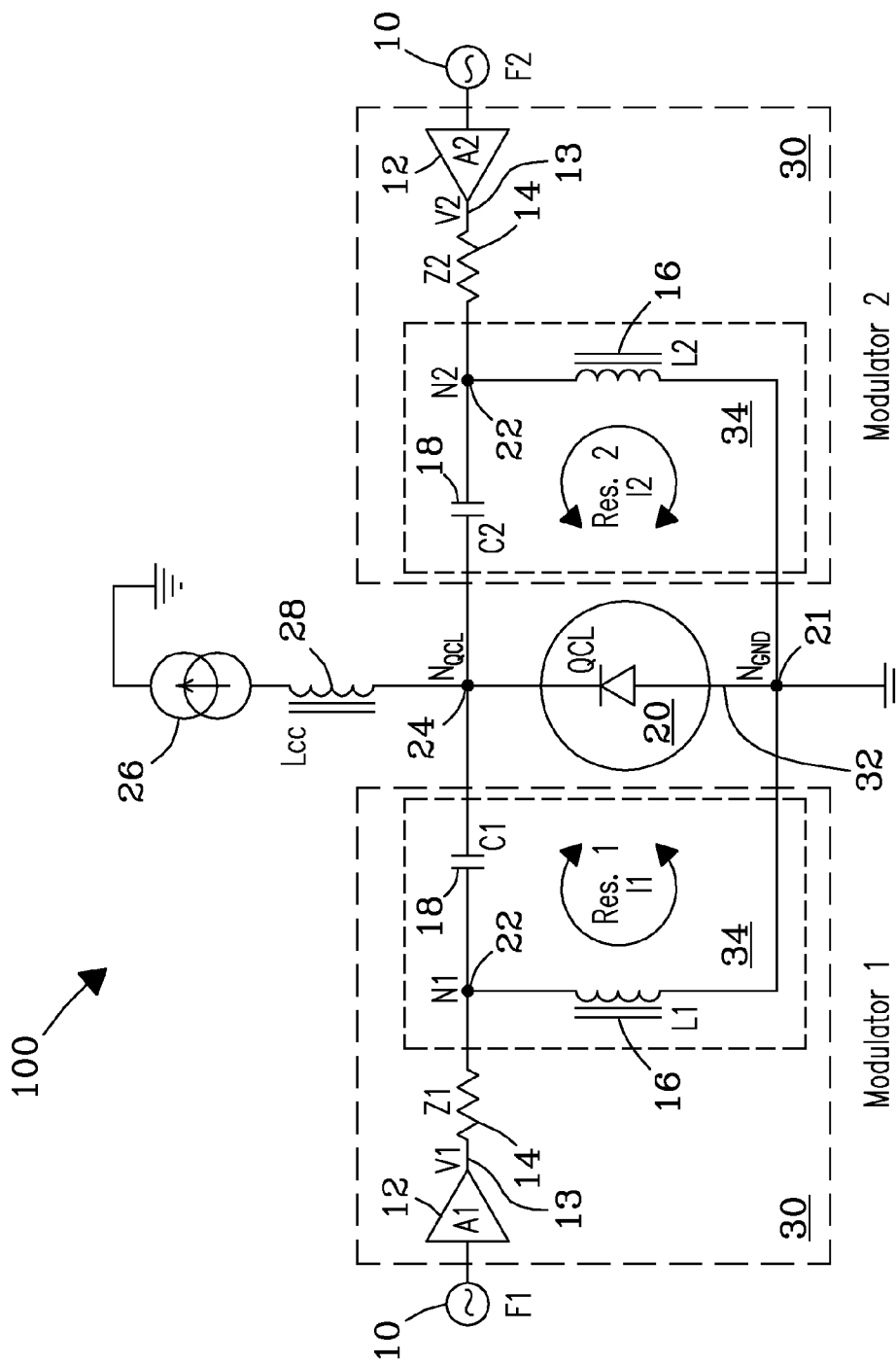
FIG. 1 shows a resonant modulation device, according to an embodiment of the invention.

A resonant harmonic modulation device and process are described that provide rapid modulation of resonant harmonic frequency waveforms to electrical transduction devices including, e.g., laser devices. A DC bias current is provided via a current controller that delivers an average current level through the electrical device that ensures that the instantaneous total current through the device is unipolar (i.e., positive or negative) as described in reference to figures further herein. The apparatus includes modulation loops that are isolated from the current controller by an inductor placed in series with the current controller. Buffers (or buffer amplifiers) that drive the modulation loops are also isolated from the DC bias current by a capacitor located within each modulation loop segment, and hence from the DC voltage generated by the current from the current controller that is delivered across the electrical device. With this invention, faster modulation is obtained through the resonant modulation loops than can be provided by the current controller alone. Need for, and advantages provided by, the invention exist at the intersection of three discussions: 1) laser modulation and implementation, 2) nature of quantum cascade lasers, and 3) limitations of laser current controllers, discussed further herein. In addition, current-recycling effects associated with parallel resonant inductor-capacitor loop segments (circuits) of the invention are novel. The novelty of the invention is extended by the capability of executing harmonic addition of sinusoids to produce arbitrary waveforms, as described further herein. It will be clear from the description that the invention is not limited to the illustrated embodiments but also includes a variety of modifications. Therefore the present description should be seen as illustrative and not limiting. The invention covers all modifications, alternative constructions, and equivalents falling within the spirit and scope of the invention as defined in the claims. While the electrical device described in the preferred embodiment of the invention is a quantum cascade laser (QCL), it should be understood that the invention is not limited thereto. All electrical transduction devices as will be selected by those of ordinary skill in the art are within the scope of the invention.

Modulation of Electrical Devices

Often transduction devices require a modulated drive input, in order to produce a modulated output for particular applications. Inventions involving modulation have enabled technologies spanning radio and avionics, television and video systems, telephone systems, satellite communications and deep space networks. They also feature strongly in standard electro-optic techniques such as frequency modulation for noise reduction in optical detection used in laser-based systems for sensor and other applications. The invention finds application in current modulation of quantum cascade lasers or other laser devices, including, but not limited to, e.g., signal-to-noise-ratio enhancement for chemical sensing and in chemical sensing systems. Here, the transduction device is a quantum cascade or other semiconductor laser. And, the drive input is the current used to operate the quantum cascade laser, which is usually (but not necessarily) derived from a constant current controller. A constant drive current correctly applied to an ideal monochromatic laser device will produce an optical output of single stable amplitude and optical frequency. In most semiconductor (and many other) laser devices, as the drive current is varied (or modulated), both the frequency and amplitude of the laser's optical output vary accordingly, these two effects being referred to as Frequency Modulation (FM) and Amplitude Modulation (AM), respectively. There are many instances where such a variation in one or both of these quantities is desired, such as the application of standard frequency modulation for noise-reduction purposes, optical encoding, with such resulting applications as optical communications, laser stabilization, and chemical sensing. The modulation level is expressed in terms of AM index (i.e., proportion of the total optical amplitude over which the laser output amplitude varies due to the modulation), or as a phase modulation index (also known as FM index) for FM optical output (number of radians over which the optical field varies due to modulation), or FM depth for larger modulations (the number of Hertz through which the optical field varies over the modulation cycle). In many cases, the required modulation level is small, with typical peak-to-peak modulation current amplitudes required to produce them being less than 10% of the total drive current being supplied by the current controller, although, this number is somewhat arbitrary. These otherwise normal levels of modulation are readily produced by providing sinusoidal waveforms to the laser device in direct addition to the constant current being supplied. This modulation process is neither limited to single modulation signals, or indeed sinusoids. In fact, any combination of arbitrary signals can be applied to a laser device in this manner. "Large" modulation signals will now logically include anything beyond what is characterized as "small", all the way up to "full-depth" modulation, in which the drive current of the laser device is periodically turned completely off and then back on by the modulation, either in a sinusoidal or other periodic fashion. Such modulation is usually applied to laser devices from which 100% amplitude modulated output is required. In such circumstances, it is often the case that non-sinusoid waveforms are required. Indeed, a perfect square-wave may be imagined in theory to be the best modulation waveform for this requirement. However, it may not be so in practice, as the sharp edges of a high fidelity square wave can induce instability in many laser devices. Often a waveform that approaches a square-wave but still with rounded edges and finite rise and fall times produces better results. The method of application of such signals varies depending on the frequency and amplitude of the modulation signal, and the capability of other devices in the setup, in particular, the current controller. Several modulation scenarios will now be described.

Scenario 1: If the modulation frequency is within the bandwidth of the current controller being used, and the depth of the modulation is not so large that rise and fall times reach beyond the slew-rate (described, e.g., in "The Art of Electronics", Paul Horowitz and Winfield Hill, second edition, Cambridge University Press, page 403.) of the controller, then, the modulation signal originating from a signal generator or other generating device (e.g., a computer) can be fed to the current controller, which then produces the modulated drive current directly. Slew-rate is one of a number of primary factors that differentiates a "small-signal bandwidth" from a "power bandwidth". This scenario equally covers small and large modulations as characterized above, providing the conditions stated are met.

Scenario 2: If the frequency of the modulation is beyond the small-signal bandwidth of the current controller, but the required amplitude is small, then such a signal can be added to the drive current fed directly to the laser device using a suitable passive cross-over network (e.g., see http://en.wikipedia.org/wiki/Audio_crossover), a bias-T (e.g., see http://en.wikipedia.org/wiki/Bias_tee), and/or an active auxiliary modulation device (e.g., as detailed in U.S. Pat. Nos. 6,696, 887; and 7,176,755). In the present invention, the current controller does not participate in the modulation process, and is preferably isolated from the modulation signals by suitable components such as inductors, as described further herein. Here, the modulation signal can still originate directly from a signal generator or computer, although in higher frequency regimes, an RF signal generator is preferred. An amplification stage can also be used prior to injection into the laser device.

Scenario 3: The combination of modulation frequency and amplitude is beyond the capability of the current controller, and must therefore be effectuated by an external device. This case can apply to a range of modulation conditions, from moderately large high-frequency signals, to very large moderately low-frequency signals that are still beyond the range of a selected current controller. The external device applying the modulation signal to the laser may need to be quite powerful, providing significant rapidly alternating current, and may take the form of large power amplifiers or signal generation networks. A principal feature of the current invention is the use of a resonant circulating current that alleviates the need for a very large and powerful modulation driver, thus allowing such a modulation system to be smaller, more efficient, and more compact.

The Nature of Quantum Cascade Lasers

Quantum Cascade Lasers (QCLs) are inter-sub-band devices, meaning that the lasing transition occurs within one band. This results in a smaller energy transition, and thus a longer operating wavelength. Hence, these devices typically operate in the 3 to 20 micron region. In diode laser devices, the lasing transition occurs between bands. Thus, they typically operate in the visible and near-infrared (0.4 to 2 micron) regions. QCLs are in principal quantum-well devices with alternating quantum-well and injector structures. Such devices can be engineered to give specific wavelengths of operation, which can thus be tailored during the design phase to meet specific needs, e.g., for use in the "optical fingerprint region" where there are many strong, fundamental chemical signatures of interest. QCLs generally operate at significantly higher current than their diode laser counterparts, and due to the cascade of multiple lasing regions alluded to hereinabove, they often require more compliance voltage. Hence, while a typical diode laser may operate at 150 mAmps with 1.8V, currently a typical QCL can operate at 900 mAmps with 8V. Newer devices will operate at current levels beyond 2 Amps. Moreover, QCLs can still be modulated rapidly and deeply. This, for example, allows certain QCLs to be driven with a 100 kHz, 0-to-2 Amp square-wave.

Limitations of Current Controller

The agile higher power requirements of QCLs place new demands on current controller technology, which has led to new current controller developments, as detailed, e.g., in U.S. Pat. Nos. 6,696,887 (Transistor-Based Interface Circuitry) and 6,867,644 (Current Control Circuitry), and U.S. patent application Ser. No. 12/492,390 filed 26 Jun. 2009. These current controllers are extremely low noise, very stable, and very agile, allowing modulation waveforms to be applied directly to QCLs with a minimum of complications. In particular, the only external device needed to achieve such modulation is a signal generator. However, the earlier of these devices is still "linear" in nature, meaning that they are limited in efficiency, on the order of 60%. Because of heat dissipation requirements, many controllers are still moderately large in size (e.g., ~2.75×9×10 inches for some controllers developed at Battelle, Pacific Northwest Division, Richland, Wash., USA) or larger for most equivalent commercial units. While not uncommon in the industry currently, controllers with these levels of efficiency and size still limit uses of QCLs in fieldable applications where space and power are at a premium, especially when multiple channels of optics and electronics are required. The trend of requiring and building multi-channel QCL instruments is one that is continuing, and shows no sign of slowing. This has led to development of other controller technologies specifically designed to overcome efficiency and space limitations, e.g., those that are based on a hybrid switch-mode and/or a linear combination. While switch-mode devices are stable and quiet, one drawback of their switch-mode architecture is that they are not as agile as are linear counterparts because the switching frequency limits the regulation bandwidth, which in turn limits the control bandwidth. While in theory it is possible to continually extend the bandwidth of a hybrid controller to the point where it is sufficiently agile, this pathway is not the most expedient route for providing deep, high-speed modulation capability. Indeed, ultimately it may not even be practical to pursue this path. Currently, deep modulation at frequencies beyond a few kHz is not possible through hybrid current controllers, hence the need for an external modulation device that can effectuate deep and rapid modulation of QCLs. The need for small size and efficiency dictates that the modulation device cannot consist of large power amplifiers or signal generation networks, hence, the formulation of resonant circulating current modulation, and the linear combination of multiples of such currents to produce arbitrary waveforms inside QCL devices.

Resonant L-C Circuits and Resonant Modulation

The invention incorporates the characteristic of a parallel resonance formed by coupling an inductor and a capacitor in a loop segment that, when operated at the resonant frequency, chiefly deploys a circulating current that is dictated by the values of the components. Once in this state, the only external input required to maintain the internally oscillating current is an amount that is equal to the losses, which this external input replaces, due to imperfections in the inductor and capacitor that form the resonance, and the connections between them. For such a simple resonance, these losses are typically mainly due to ohmic resistance of the inductor. Through action of the parallel resonance, a large circulating current through these components can be maintained by a small external current that continually replaces only that portion of the circulating current lost through ohmic resistance and parasitic effects inside each of the resonant components.

QCLs (and diode lasers) have a relatively low AC resistance. This means, that once in their operating region, an increase in current through the laser device doesn't produce a commensurate increase in voltage across the laser device. For QCLs, a typical AC resistance for a 1-Amp device is on the order of one or two ohms. Insertion of a QCL into the resonant circuit allows the circulating current to pass through the QCL, which, due to the AC resistance, effects the resonance to a degree. But, the net effect is an enhancement in magnitude above the magnitude of the injection current, which would be the total modulation current in the absence of the resonant enhancement.

Arbitrary Waveform Construction Through Harmonic Superposition

One potential disadvantage of the resonant modulation technique of placing a QCL within an L-C resonance, modulation loop segment, is that a single modulation loop when operated at resonance can only induce a single sinusoidal modulation current through the laser, or electrical device. However, there is nothing preventing the QCL from being part of two or more resonant modulation segments. This can be done to produce two or more separate and distinct modulation currents in a single device, which is sometimes required. Or, when such signals are in the appropriate relative amplitudes and phases, such signals can be used to produce arbitrary waveforms. For example, the Fourier expansion of a square wave is given by Equation [1], as follows:

$$x_{square}(t) = \frac{4}{\pi} \sum_{k=1}^{\infty} \frac{\sin((2k-1)t)}{(2k-1)}. \quad [1]$$

As few as two harmonic components (which in the case of a square wave are the fundamental and the third harmonic) can be used to produce a desired physical effect, e.g., in the QCL (or another laser device). Moreover, the behavior of the QCL (or other laser device) can be even better than if it had been modulated with a precise square wave for the reasons alluded to above, namely the absence of ringing and extremely sharp rising and falling edges, which could otherwise disturb the operation of the laser device. This work has also demonstrated that often only the fundamental modulation signal is required where conventional wisdom has considered it necessary to apply multiple harmonic components of a full square wave. Results demonstrate that this conventional wisdom is not a general rule. Still, harmonic addition capability remains an important aspect of the invention.

FIG. 1 shows a resonant modulation (circuit) driver device 100, according to an embodiment of the invention that provides rapid modulation of current drive waveforms to electrical devices, e.g., lasers. In the figure, a pair of resonant modulators 30 connect to a quantum cascade laser (QCL) 20 via a common leg segment 32 defined between laser node ($N_{QCL}$) 24 and ground node ($N_{GND}$) 21. While two resonant modulators 30 are shown, number is not limited thereto. For example, device 100 is of a modular design that allows a single resonant modulator 30, or multiple resonant modulators 30 to be incorporated. Modulators 30 provide at least one enhanced current waveform to QCL 20. In the current embodiment containing two modulation loop segments 34, two enhanced current waveforms are superimposed and provided as an output to QCL 20 for execution therein, as described further herein in reference to FIG. 3. Depending on the embodiment, QCL 20 can be positioned in one resonant modulation loop 30, or at the intersection of two or more resonant modulation loops 30, or at the intersection of multiple modulators 30, and the current pathway of current controller 26 that supplies a DC bias current, as described further herein. In the figure, modulators 30 each include an inductor-capacitor loop segment 34 configured with an inductor 16 and capacitor 18. In combination, inductor 16 and capacitor 18 in each inductor-capacitor loop segment 34 form a resonant circuit that provides for circulation and enhancement of alternating current therein. QCL 20 is positioned within these resonant circuits by connection of inductor-capacitor loop segments 34 (loops) of modulators 30 between laser node ($N_{QCL}$) 24 and ground node ($N_{GND}$) 21. Inductor-capacitor loop segments 34 include an inductor-capacitor node (N1 or N2) 22 located between an inductor 16 and a capacitor 18, to which is supplied an AC modulation current from AC signal source devices 10 [either signal generators or computer analog outputs, with power amplifiers (A1 and A2) 12]. As current flows back and forth around inductor-capacitor loops 34 at the resonant frequencies determined by the value of inductors 16 and capacitors 18, energy is transferred repeatedly between the inductors 16 and capacitors 18. In such a resonance, and when operating at resonant frequency, the inductors 16 possess all of the stored energy (as magnetic energy) when current flow reaches a maximum, and the capacitors 18 possess all the energy (as internal electric potential energy) when the current flow stops at each half cycle before reversal. Because the circulating current moving through resonant modulators 30 (and thus also through the QCL 20) is greater in magnitude than that of the source current supplied by AC current generation devices 10, inductor-capacitor loop segments 34 of modulators 30 provide resonant enhancement of source current received from current source device 10. Resonant enhancement of current by all inductor-capacitor loop segments 34 of modulators 30 is provided to QCL 20 via common leg segment 32. Current source devices (F1 and F2) 10 supply source current (energy) to modulators 30 at inductor-capacitor nodes ($N_1$ and $N_2$) 22. Amplifiers (A1 and A2) 12 amplify signals (or AC source currents) delivered from current sources (F1 and F2) 10, providing sinusoidal peak-to-peak voltages (V1 and V2) 13 as outputs, which, in conjunction with respective impedances (Z1 and Z2) 14 provide drive to nodes ($N_1$ and $N_2$) 22, which supports the circulating current in modulator loops 34. Energy lost from respective inductor-capacitor loop segments 34 of modulators 30 by transfer to, or dissipation via QCL 20, is replenished by sources 10 at inductor-capacitor nodes ($N_1$ and $N_2$) 22 via connection to impedances 14 (i.e., Z1 and Z2). Impedances 14 provide a suitable impedance buffer between amplifiers (A1 and A2) 12 and inductor-capacitor loop segments 34 (resonant circuits 34). Amplifiers (A1 and A2) 12 thus supply pre-selected AC currents to inductor-capacitor loops 34. Impedances (Z1 and Z2) 14 provide an impedance buffer that give a degree of isolation between amplifiers (A1 and A2) 12 and the voltages appearing at nodes (N1 and N2) 22 and possible resulting currents in amplifiers (A1 and A2) 12 from these nodes in respective inductor-capacitor loop segments 34, such voltages appearing due to the action of other modulation loop segments 34 that are connected in common with all such loops through common leg 32. In this manner, impedances (Z1 and Z2) 14 thus protect amplifiers (A1 and A2) 12 from disruption from such voltages and currents within inductor-capacitor modulation loops 34, which further protects amplifiers (A1 and A2) 12 from disruption and overload and inductor-capacitor modulation loops 34 from excessive drive conditions that can arise from amplifiers (A1 and A2) 12. Amplifiers (A1 and A2) 12 preferably have a low output impedance so that minimal disturbance occurs to amplifiers (A1 and A2) 12 from signals appearing at nodes 22, and in turn so that the coupling impedances 14 (Z1 and Z2) can be made sufficiently small to allow sufficient AC current to pass from amplifiers 12 (A1 and A2) into nodes 22, and thus into inductor-capacitor (modulation) loop segments 34.

Common leg segment 32 defined between laser node ($N_{QCL}$) 24 and ground node ($N_{GND}$) 21 connects to laser current controller 26 through inductor ($L_{CC}$) 28. Current controller 26 supplies a constant DC bias current that is delivered through common leg segment 32 to QCL 20. QCL 20 is thus driven, in part, by the constant DC current from laser current controller 26. The DC voltage at the current controller end of inductor ($L_{CC}$) 28 varies far less than the voltage at the QCL end of inductor ($L_{CC}$) 28. The voltage appearing at the QCL end of inductor ($L_{CC}$) 28 corresponds to the AC voltage delivered across QCL 20. Voltage variations across QCL 20 arise from currents that oscillate in modulation loops 34. Inductor ($L_{CC}$) 28 thus isolates current controller 26 from voltages that could potentially interfere with operation of the current controller.

Capacitors 18 positioned in inductor-capacitor loop segments 34 isolate amplifiers 12 in a similar manner from the DC voltage appearing across QCL 20 from the DC bias current delivered through inductor 28 from current controller 26 to QCL 20. DC voltages experienced at nodes 22 is zero as a result of capacitors 18, which effectuates proper coupling of buffers (A1 and A2) 12 to modulators 30.

The present configuration provides enhancement of currents in resonant modulators 30 at respective resonant frequencies. In particular, the low AC impedance of QCL device 20 allows only moderate disturbance of circulating current waveforms contained within resonant modulators 30, which in turn permits multiple and enhanced resonant currents to be superimposed through QCL 20, while requiring smaller currents from amplifiers (A1 and A2) 12 to maintain these higher circulating currents in resonant modulation loops 34. The configuration of modulation device 100 further relaxes agility and frequency response requirements that would otherwise have to be imposed on current controllers in order for them to be able to deliver the required modulation performance to the QCL, which the invention allows. The DC bias current provides an average current that drives the laser. The DC bias current is delivered through inductor ($L_{CC}$) 28, which current is added to respective enhanced current waveforms supplied from individual resonant modulators 30, thereby providing the average drive current to the QCL 20. The average drive current in turn is responsible in general for the average (optical) output power of the QCL device, although the exact proportion of the output power provided (or represented) by the DC drive is dependent on the light output vs. current (LI) curve of the QCL. The fact that the invention allows dynamic modulation of waveforms to be applied to QCL device 20 in a manner completely independent of current controller 26 means that waveforms are no longer limited by the frequency response or dynamic range of current controller 26. The functional separation of components provided by resonant modulation driver device (circuit) 100 further provides full-depth AC modulation of waveforms that are supplied to QCL device 20 that are significantly higher in frequency than are possible using current controller 26 alone. Resonant modulators 30 independently provide at least one AC current waveform of a pre-selected type, including portions thereof, that are superposed in common leg segment 32 and delivered to QCL 20 for execution by QCL 20. The present configuration allows for dynamic modulation and development of arbitrary current waveforms that can then be applied to QCL 20. In particular, a pre-selected number of enhanced alternating current waveforms from modulators 30 can be summed together to achieve desired modulation waveforms in QCL laser 20. The invention thus provides for formation of any number of arbitrary waveforms.

Figure 2:
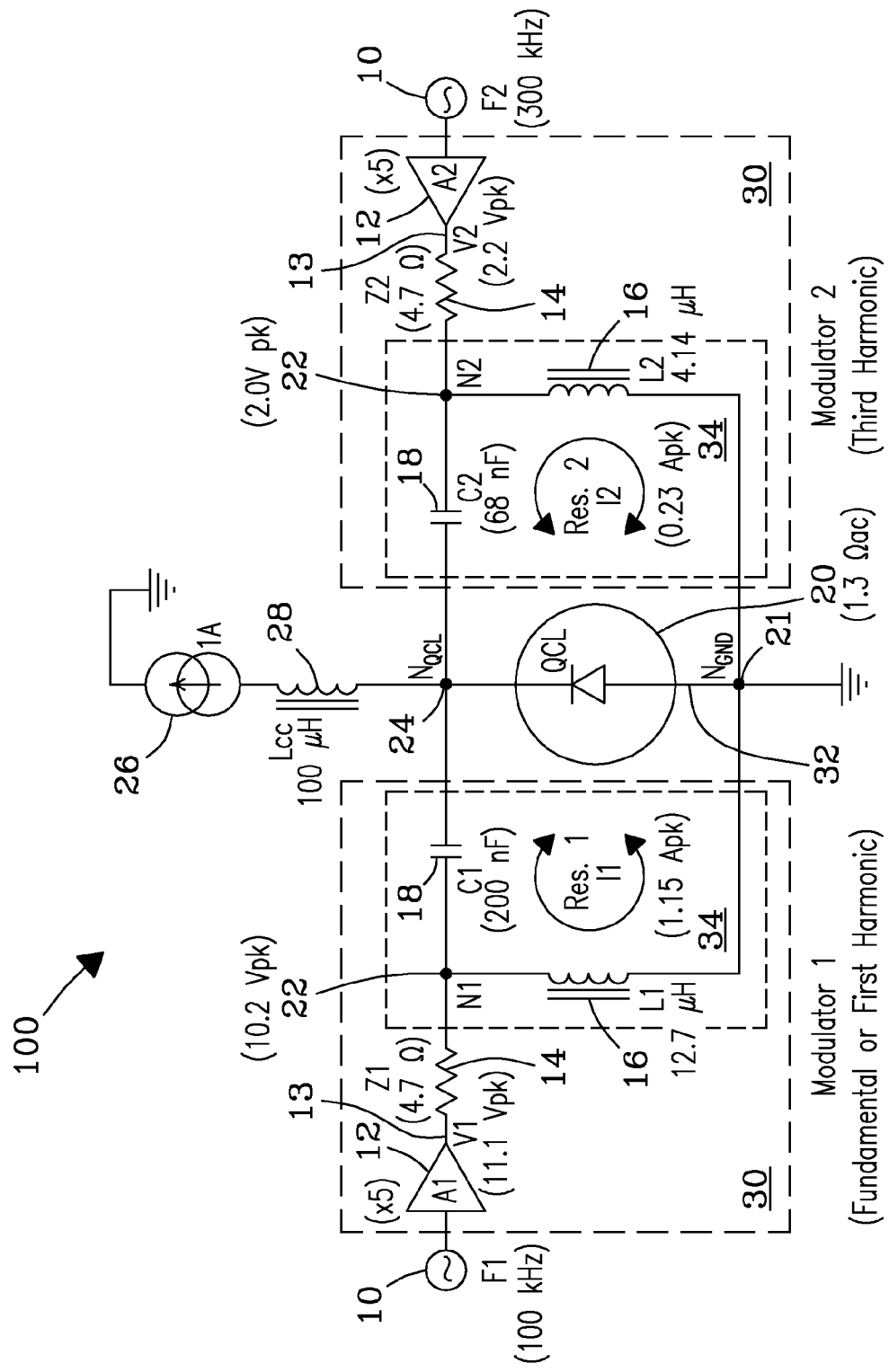
FIG. 2 is a diagram showing exemplary values of components for a resonant modulation driver device, according to an embodiment of the invention.

FIG. 2 presents exemplary service values for components operating in resonant modulation driver circuit 100 described previously herein in reference to FIG. 1, according to an embodiment of the process of the invention. As an example, a first current source device 10 (F1) supplies a 100-kHz source current that provides a sinusoidal peak-to-peak voltage 13 of 11.1 V, which, in conjunction with impedance (Z1) 14 of 4.7-ohms (4.7Ω) provides drive to node (N1) 22. Drive at node (N1) 22 supports the circulating current within modulator loop 34 of 1.15 Amps (peak-to peak). In this embodiment, inductor-capacitor loop segment 34 of modulator 30 includes an inductor 16 of value 12.7 µH that is coupled to capacitor 18 of value 200 nF. This modulator 30 provides a 100-kHz fundamental (or first harmonic) component for generation of a quasi-square wave, which, in the present embodiment is generated by the interaction of both modulation loops 30. A second current source device 10 (F2) supplies a 300-kHz sinusoidal source current of a sinusoidal peak-to-peak voltage of 2.2 V, which, in conjunction with an impedance (Z2) 14 of 4.7-ohms (4.7Ω) provides drive to node (N2) 22. Drive at node (N2) 22 supports a circulating current within modulator loop 34 of 0.23 Amps (peak-to peak). Inductor-capacitor loop segment 34 of this modulator 30 includes an inductor 16 of value 4.14 µH that is coupled to a capacitor 18 of value 68 nF. Service values can be calculated numerically using mathematical modeling software, but is not limited thereto. For example, a heuristic approach can also be used to obtain other suitable performance values. Thus, no limitations are intended. All values as will be selected for the invention by those of ordinary skill in the art are within the scope of the invention.

Figure 3:
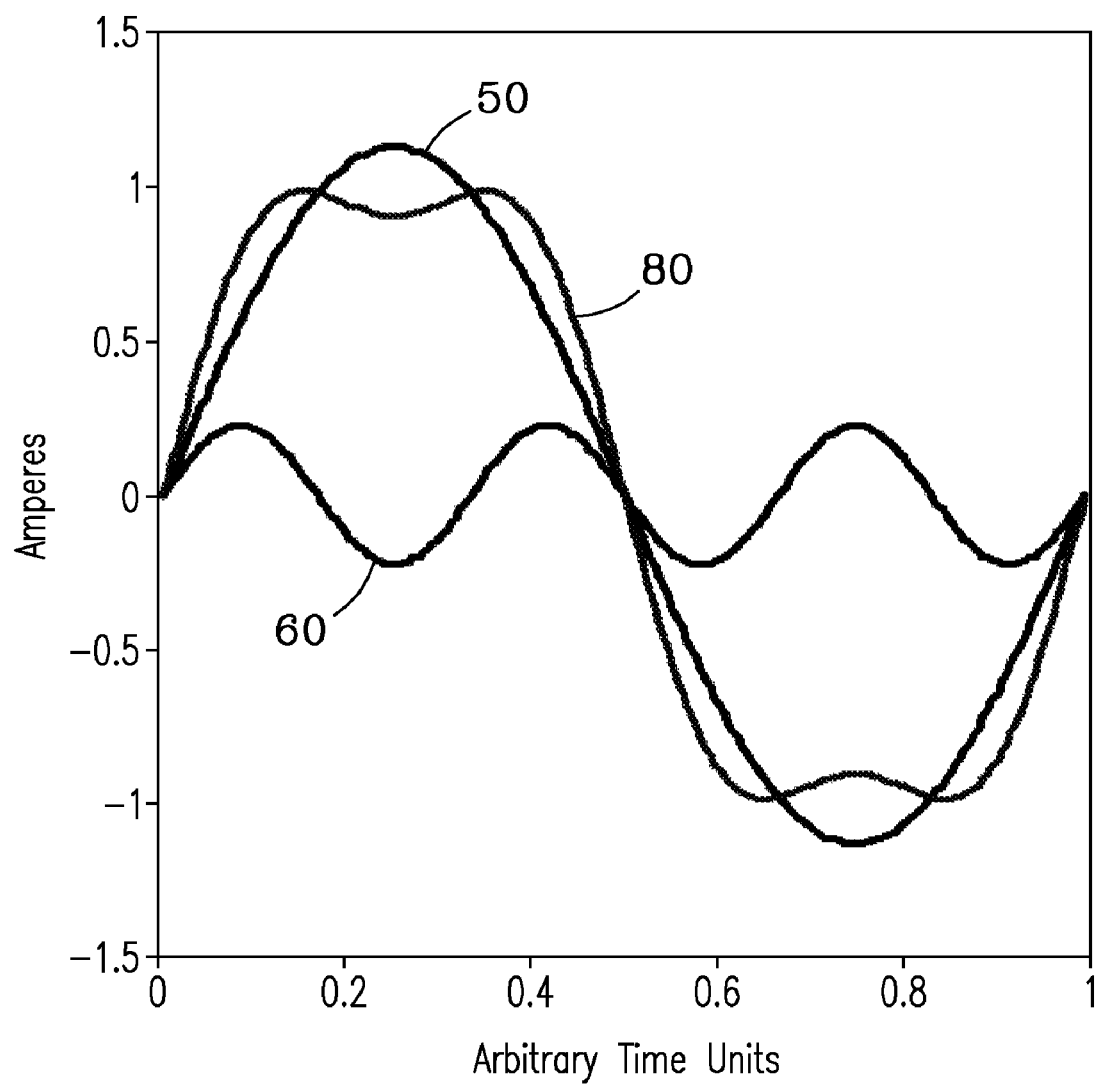
FIG. 3 shows a composite modulation waveform generated by the resonant modulation device through harmonic addition, according to an embodiment of the invention.

Waveform modulation driver device 100 superposes single enhanced current waveforms generated by respective modulators 30 having specific harmonic relationships, and various amplitudes and phases, to provide arbitrary current waveforms for QCL laser 20. FIG. 3 shows an exemplary quasi-square modulation waveform 80 generated by the invention. Waveform 80 is generated by superposition of current waveforms 50 and 60 each respectively generated in respective modulators described previously in reference to FIG. 2 herein. Waveform 50 is an exemplary sinusoid generated from a 100-kHz source current in a first modulator and is the first harmonic of the composite waveform generated in the common segment leg (FIG. 2) and thus through the QCL. Waveform 60 is a sinusoid generated from a 300-kHz source current in a (second) modulator, and is a third harmonic of the composite waveform generated (albeit 2nd) in the common segment leg. It should be noted that even-order (e.g., second) harmonics are zero for symmetric waveforms. Superposition of waveforms 50 and 60 provides waveform 80 as the modulation waveform (described previously herein) that is the composite waveform provided to the QCL or another electrical device. The number of resonances (and thus additional frequencies) that can be superposed (added) to produce arbitrary waveforms of arbitrary accuracy as outputs to a single electrical device (e.g., a QCL) is not limited. And, waveform types are not intended to be limited to the exemplary waveforms shown. For example, other waveforms are possible in concert with the invention, including, but not limited to, induction of, e.g., high-speed triangle waveforms, ramp waveforms. While a number of embodiments of the present invention have been shown and described, it will be apparent to those skilled in the art that many changes and modifications may be made without departing from the invention in its broader aspects. The appended claims, therefore, are intended to cover all such changes and modifications as fall within the true spirit and scope of the invention.

I claim:

1. A resonant frequency modulation apparatus that provides a current modulation waveform for modulation of an electrical device, characterized by:
    at least one inductor-capacitor modulation loop segment that generates an enhanced current with a magnitude greater than or equal to a magnitude of a source current from a current source device, said enhanced current generates at least one resonant frequency waveform that is provided as a composite current waveform through a common-leg segment to said electrical device, wherein said electrical device is a laser device.

2. The apparatus of claim 1, wherein said current source device is selected from the group consisting of: signal generators, current generators, voltage generators, amplifiers, transformers, and combinations thereof.

3. The apparatus of claim 1, wherein said current source device is an AC current source device.

4. The apparatus of claim 1, wherein said source current is provided to said at least one modulation loop segment at a node different from a node in said common-leg segment that connects said modulation loop segment to said electrical device.

5. The apparatus of claim 1, further comprising two or more modulation loop segments operably connected through said common-leg segment to said electrical device, said common-leg segment superposes individual resonant frequency waveforms from said individual modulation loop segments and provides a composite modulation waveform to said electrical device.

6. The apparatus of claim 1, further comprising a DC current controller operably connected that provides a constant DC bias current through said common-leg segment to said electrical device.

7. The apparatus of claim 6, further comprising an inductor operably connected to said DC current controller that isolates said DC current controller from said resonant frequency waveforms applied through said common-leg segment to said electrical device.

8. The apparatus of claim 7, further comprising a driving buffer amplifier operably connected to said at least one resonant modulation loop segment, said driving buffer amplifier is isolated from said DC current controller and said DC bias current by a capacitor located within said at least one resonant modulation loop segment.

9. The apparatus of claim 8, further comprising an impedance operably connected to said driving buffer amplifier and said current source device, said impedance isolates said at least one modulation loop segment at an inductor-capacitor node that protects said at least one modulation loop segment and said driving buffer amplifier.

10. A method for modulating current in an electrical device, characterized by the steps of:
enhancing a source current in at least one resonant frequency modulation loop segment to a magnitude greater than or equal to a source current magnitude;
forming a composite (current) waveform from at least one enhanced resonant frequency (current) waveform generated in said at least one frequency modulation loop segment; and
delivering said composite (current) waveform to said electrical device to modulate current thereof, wherein said electrical device is a quantum cascade laser, a semiconductor laser, or another laser device.

11. The method of claim 10, further including the step of supplying a DC bias current to drive said electrical device and said composite current waveform provided by said at least one modulation loop segment.

12. The method of claim 11, wherein said DC bias current is a constant DC bias current.

13. The method of claim 10, wherein the step of enhancing said source current includes varying one or more parameters of said at least one resonant frequency modulation loop segment selected from the group consisting of: current, voltage, impedance, inductance, capacitance, and combinations thereof.

14. The method of claim 10, further including the step of: superposing at least two enhanced resonant frequency waveforms to form a composite modulation waveform that is provided as an output to said electrical device.

15. The method of claim 10, wherein at least two resonant modulation loops are used to generate at least two enhanced resonant frequency waveforms, wherein said waveforms and/or components thereof are superimposed to form a composite modulation waveform that is provided as an output to said electrical device.

16. The method of claim 15, wherein said at least two enhanced resonant frequency waveforms are harmonics of said composite modulation waveform.

17. The method of claim 16, wherein said composite modulation waveform is selected from the group consisting of: square waveforms, quasi-square waveforms, triangle waveforms, sawtooth waveforms, arbitrary waveforms, and combinations thereof.

* * * * *